US012787885B2

(12) United States Patent
Lee

(10) Patent No.: US 12,787,885 B2
(45) Date of Patent: Nov. 3, 2026

(54) ELECTRONIC APPARATUS AND METHOD OF FABRICATING THE SAME

(71) Applicant: AUO Corporation, Hsin-Chu (TW)

(72) Inventor: Chih-Tsung Lee, Hsin-Chu (TW)

(73) Assignee: AUO CORPORATION, Hsin-Chu (TW)

(*) Notice: Subject to any disclaimer, the term of this patent is extended or adjusted under 35 U.S.C. 154(b) by 413 days.

(21) Appl. No.: 18/545,341

(22) Filed: Dec. 19, 2023

(65) Prior Publication Data

US 2024/0312971 A1 Sep. 19, 2024

(30) Foreign Application Priority Data

Mar. 17, 2023 (TW) ................................ 112109994

(51) Int. Cl.
*H05K 1/02* (2006.01)
*G01N 27/447* (2006.01)
(Continued)

(52) U.S. Cl.
CPC .......... *H10W 90/00* (2026.01); *H05K 1/0277* (2013.01); *H05K 1/0283* (2013.01);
(Continued)

(58) Field of Classification Search
CPC ...... H05K 1/189; H05K 1/0283; H05K 1/118; H05K 1/147; H05K 3/361; H05K 3/0014; H05K 3/4038; H10W 90/00; H10W 20/435; H10W 20/4403; H10W 70/685; H10W 72/241; H10N 39/00; G01N 33/50;
(Continued)

(56) References Cited

U.S. PATENT DOCUMENTS 6,362,433 B1 * 3/2002 Takahashi ................ H05K 3/28 174/255
6,443,179 B1 * 9/2002 Benavides ........ B01L 3/502707 137/454.2
(Continued)

FOREIGN PATENT DOCUMENTS

CN 104347591 A 2/2015
CN 106252236 A 12/2016
(Continued)

*Primary Examiner* — Maliheh Malek
(74) *Attorney, Agent, or Firm* — Tim Tingkang Xia, Esq.; Troutman Pepper Locke LLP

(57) ABSTRACT

An electronic apparatus includes a component layer and a channel layer overlapping with each other. The component layer has a plurality of functional areas separated from each other and a connection area outside the functional areas. The component layer includes a plurality of electronic components disposed in at least some of the functional areas. The channel layer includes at least one stretchable layer, a plurality of first microfluidic channels and a first liquid conductor. The first microfluidic channels are disposed in the at least one stretchable layer, and extend through the functional areas and the connection area. The first liquid conductor is filled in the first microfluidic channels and is electrically connected to at least some of the electronic components. Each of the first microfluidic channels is provided with a buffer bag. A method of fabricating an electronic apparatus is also provided.

19 Claims, 13 Drawing Sheets

(51) Int. Cl.

| | |
|---|---|
| ***H05K 3/36*** | (2006.01) |
| ***H10N 39/00*** | (2023.01) |
| ***H10W 20/41*** | (2026.01) |
| ***H10W 20/44*** | (2026.01) |
| ***H10W 90/00*** | (2026.01) |
| *H05K 1/11* | (2006.01) |
| *H05K 1/189* | (2026.01) |

(52) U.S. Cl.
CPC .......... *H10N 39/00* (2023.02); *H10W 20/435* (2026.01); *H10W 20/4403* (2026.01); *G01N 27/44791* (2013.01); *H05K 1/118* (2013.01); *H05K 1/189* (2013.01); *H05K 3/361* (2013.01)

(58) Field of Classification Search
CPC .............. G01N 33/49; G01N 27/44791; B01L 3/502707; B01L 3/502715; B01L 2200/12; B01L 2300/0663; B01L 2300/0816; B01L 2300/0848; B01L 3/5027–502784; B01L 2200/10; B01L 2200/027; B81C 1/0023; Y10T 29/49155; B81B 2201/05–058; C12Q 2565/629; B01J 19/0093; F16K 99/0001–0067; F16K 2099/0073–008; F16K 2099/0082–0098; C12M 23/16
See application file for complete search history.

(56) References Cited

U.S. PATENT DOCUMENTS

| | | | | |
|---|---|---|---|---|
| 6,548,895 | B1 * | 4/2003 | Benavides | H10W 40/47 257/784 |
| 7,696,441 | B2 * | 4/2010 | Kataoka | H05K 1/028 174/254 |
| 9,101,931 | B2 * | 8/2015 | Supriya | B05D 3/12 |
| 9,116,145 | B2 * | 8/2015 | Li | B01L 3/502707 |
| 9,119,302 | B2 * | 8/2015 | Hattori | H05K 1/0277 |
| 9,653,613 | B2 * | 5/2017 | Yamazaki | H10D 30/673 |
| 9,930,773 | B2 * | 3/2018 | Holbery | H05K 1/0272 |
| 10,034,370 | B2 * | 7/2018 | Iwase | H05K 1/0283 |
| 10,595,402 | B2 * | 3/2020 | Iwase | H05K 1/0393 |
| 11,107,808 | B1 * | 8/2021 | Or-Bach | G06F 1/10 |
| 11,786,711 | B2 * | 10/2023 | DeSimone | A61B 17/24 606/196 |
| 11,937,381 | B2 * | 3/2024 | Mahajan | H01R 12/62 |
| 12,089,473 | B2 * | 9/2024 | Kim | G02B 26/004 |
| 12,094,829 | B2 * | 9/2024 | Or-Bach | H10D 84/0149 |
| 12,096,563 | B2 * | 9/2024 | Ronay | H05K 1/0283 |
| 12,317,415 | B2 * | 5/2025 | Jang | H05K 1/0286 |
| 12,447,670 | B2 * | 10/2025 | DeSimone | A61F 2/82 |
| 2002/0187072 | A1 * | 12/2002 | Karp | B01F 35/7182 422/946 |
| 2005/0014162 | A1 * | 1/2005 | Barth | B82Y 30/00 435/287.2 |
| 2005/0136646 | A1 * | 6/2005 | Larnerd | H05K 1/115 174/250 |
| 2005/0189645 | A1 * | 9/2005 | Nakano | H05K 1/162 257/701 |
| 2005/0226995 | A1 * | 10/2005 | Maharshak | C23C 18/00 156/278 |
| 2006/0014083 | A1 * | 1/2006 | Carlson | H05K 3/102 430/33 |
| 2006/0274055 | A1 * | 12/2006 | Reynolds | G06F 3/03547 345/174 |
| 2008/0150154 | A1 * | 6/2008 | Hedler | H05K 3/101 257/776 |
| 2008/0199362 | A1 * | 8/2008 | Chong | B01F 25/421 422/400 |
| 2009/0169427 | A1 * | 7/2009 | Supriya | B05D 5/00 422/68.1 |
| 2012/0176764 | A1 * | 7/2012 | Loher | H05K 1/0283 29/841 |
| 2013/0243655 | A1 * | 9/2013 | Li | B01L 3/502707 422/68.1 |
| 2014/0321075 | A1 * | 10/2014 | Sung | H01R 43/0249 361/767 |
| 2015/0182967 | A1 * | 7/2015 | Coursey | B01L 3/502707 427/96.4 |
| 2017/0113397 | A1 * | 4/2017 | Seo | B29C 51/10 |
| 2017/0245362 | A1 * | 8/2017 | Iwase | H05K 1/095 |
| 2018/0092206 | A1 * | 3/2018 | Iwase | H05K 1/0283 |
| 2020/0053875 | A1 * | 2/2020 | Holec | H05K 1/0298 |
| 2020/0066628 | A1 * | 2/2020 | Ronay | H05K 1/0283 |
| 2020/0129982 | A1 * | 4/2020 | Zhou | B03C 1/01 |
| 2020/0230602 | A1 * | 7/2020 | Yao | B01L 3/502715 |
| 2020/0344880 | A1 * | 10/2020 | Uno | H05K 3/12 |
| 2021/0362151 | A1 * | 11/2021 | Karunakaran | B01F 25/43172 |
| 2022/0071014 | A1 * | 3/2022 | Ronay | H05K 1/0283 |
| 2022/0102344 | A1 * | 3/2022 | Then | H10D 30/475 |
| 2022/0223759 | A1 * | 7/2022 | Chen | H10H 20/825 |
| 2022/0231098 | A1 * | 7/2022 | Kim | G02B 26/004 |
| 2023/0031505 | A1 * | 2/2023 | Yamagishi | A61B 5/6833 |
| 2023/0133303 | A1 * | 5/2023 | Agarwal | G06F 3/014 91/508 |
| 2023/0204025 | A1 * | 6/2023 | Ting | B01L 3/5027 417/413.3 |
| 2024/0014356 | A1 * | 1/2024 | Yoo | H10H 20/8506 |
| 2024/0082843 | A1 * | 3/2024 | Graudejus | B01L 3/505 |
| 2024/0207845 | A1 * | 6/2024 | Zhang | B01L 3/502715 |
| 2024/0408595 | A1 * | 12/2024 | Kotani | B32B 3/30 |
| 2025/0019824 | A1 * | 1/2025 | Kim | C23C 16/505 |
| 2025/0094380 | A1 * | 3/2025 | Mazed | G01S 17/08 |
| 2025/0379167 | A1 * | 12/2025 | Baker | H10W 72/019 |

FOREIGN PATENT DOCUMENTS

| | | | |
|---|---|---|---|
| CN | 113451538 | A | 9/2021 |
| CN | 215935164 | U | 3/2022 |
| CN | 216388606 | U | 4/2022 |

* cited by examiner

ELECTRONIC APPARATUS AND METHOD OF FABRICATING THE SAME

CROSS-REFERENCE TO RELATED PATENT APPLICATION

This non-provisional application claims priority to and the benefit of, pursuant to 35 U.S.C. § 119(a), patent application Serial No. 112109994 filed in Taiwan on Mar. 17, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an electronic apparatus and a method of fabricating the same, and particularly to an electronic apparatus having microfluidic channels and a method of fabricating the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the diverse development of application products, the stretchability of an electronic apparatus has gradually become one of the design specifications. For example, to meet the display requirements on clothing with special functions, a stretchable display panel is proposed to have an elastic substrate, a plurality of display pixels disposed on the elastic substrate, and a plurality of signal traces connecting these display pixels. To ensure the stretchability of these signal traces, the signal traces between the display pixels need to be configured in a zigzag manner, resulting in a significant decrease in the resolution of the display panel. If the layout space of these signal traces is compressed in order to improve resolution, it will increase the manufacturing difficulty of such stretchable display panel.

SUMMARY

The present disclosure provides an electronic apparatus, in which the transmission path for the electrical signals thereof is stretchable and has better stability.

The present disclosure provides a method of fabricating an electronic apparatus, which may increase the design flexibility and manufacturing elasticity of the channel layer.

The electronic apparatus according to certain embodiments of the present disclosure includes a component layer and a channel layer overlapping with each other. The component layer has a plurality of functional areas separated from each other and a connection area outside the functional areas. The component layer includes a plurality of electronic components disposed in at least some of the functional areas. The channel layer includes at least one stretchable layer, a plurality of first microfluidic channels and a first liquid conductor. The first microfluidic channels are disposed in the at least one stretchable layer, and extend through the functional areas and the connection area. The first liquid conductor is filled in the first microfluidic channels and is electrically connected to at least some of the electronic components. Each of the first microfluidic channels is provided with a buffer bag.

The method of fabricating the electronic apparatus according to certain embodiments of the present disclosure includes sequentially forming a first stretchable layer and a metal layer on a temporary substrate; performing a patterning process to the metal layer to form a plurality of metal patterns; performing a first micromachining process to the first stretchable layer to form a first microfluidic channel; performing a corrosive process to the metal patterns to form a liquid conductor; and performing a low temperature attaching process of a second stretchable layer on the first stretchable layer. The second stretchable layer covers the liquid conductor, and a processing temperature of the low temperature attaching process is lower than 20° C.

Based on the foregoing, in the electronic apparatus according to one embodiment of the present disclosure, the microfluidic channels disposed in the stretchable layer are filled with the liquid conductor, and form the electrical signal transmission paths between the electronic components. Due to the stretchability of the channel layer, when the electronic apparatus is extended, the connection area between the functional areas expands. By disposing the buffer bag, when the microfluidic channels are extended, the electrical connection between the liquid conductor and the electronic components in different functional areas may be ensured, thus further ensuring both the stretchability and stability of the electrical signal transmission paths. On the other hand, in the method of fabricating the electronic apparatus according to one embodiment of the present disclosure, the low temperature attaching process is utilized to form at least one stretchable layer, thus increasing the design and manufacturing elasticity of the microfluidic channels in the channel layer.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
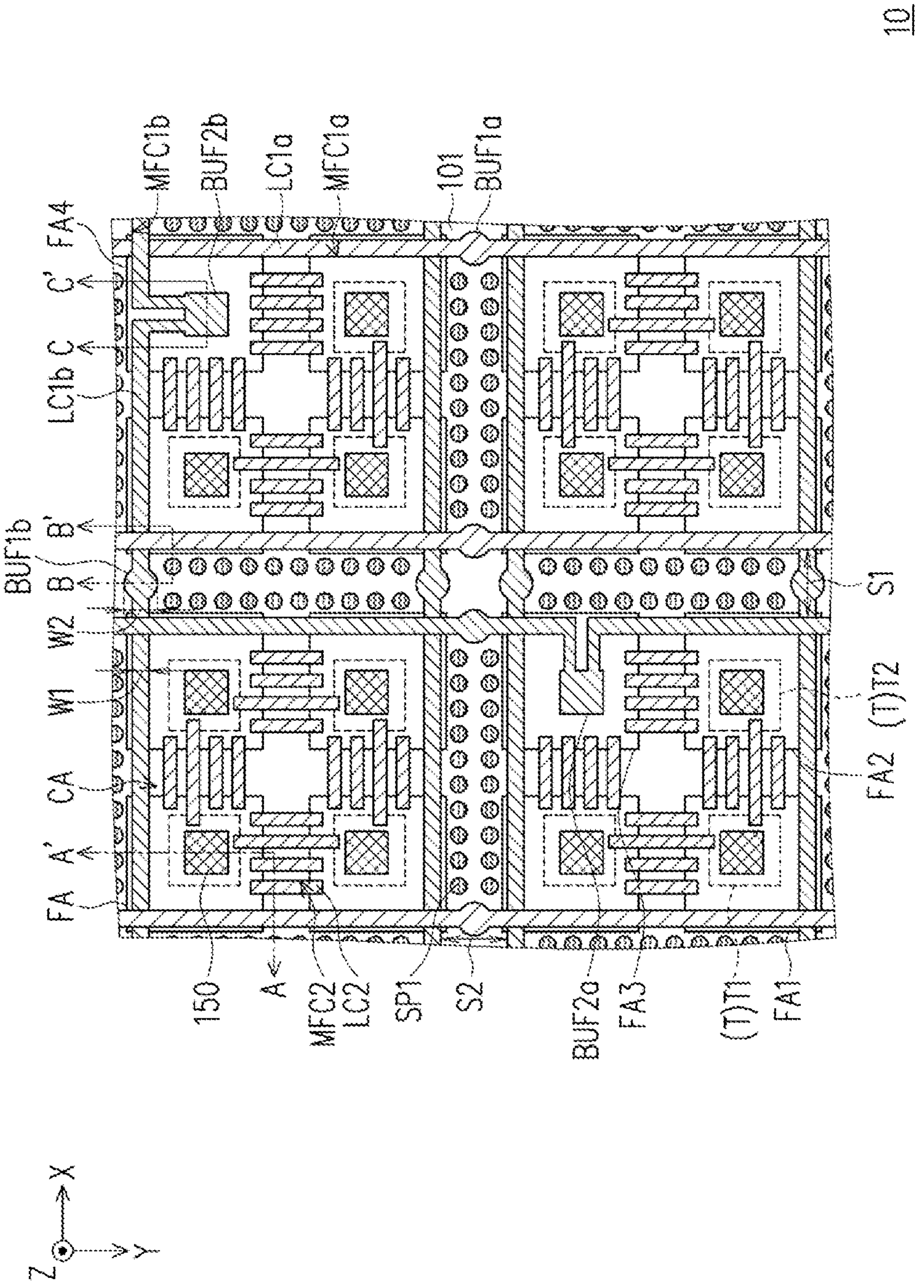
FIG. 1 is a top schematic view of an electronic apparatus according to a first embodiment of the present disclosure.

The terms "about", "approximately", "essentially" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within ±30 percent, within ±20 percent, within ±15 percent, within ±10 percent or within ±5 percent. Moreover, the terms "about", "approximately", "essentially" or "substantially" as used herein may selectively refer to a more acceptable deviation range or the standard deviation based on the measuring characteristics, the cutting characteristic or other characteristics, without applying one standard deviation to all characteristics.

In the accompanying drawings, for clarity purposes, the thickness of a layer, a film, a panel, a region, etc. may be enlarged. It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected", other components may exist between the two components.

Furthermore, relative terms, such as "lower" or "bottom", "upper" or "top", and "left" and "right", may be used herein to describe the relationship between one component and the other component as illustrated in the drawings. It should be understood that the relative terms are intended to encompass different orientations of the device in addition to the orientation in the drawings. For example, if the device in one of the drawings is turned over, components described as being on the "lower" side of other components would then be oriented on "upper" sides of the other components. The exemplary term "lower" can therefore encompasses both an orientation of "lower" and "upper," depending on the particular orientation of the accompanying drawings. Similarly, if the device in one of the drawings is turned over, components described as "below" or "beneath" other components would then be oriented "above" the other components. The exemplary terms "below" or "beneath" can therefore encompass both an orientation of being above and below.

Herein, exemplary embodiments are described with reference to sectional views of schematic diagrams of ideal embodiments. Therefore, changes of shapes in the drawings that are used as results of manufacturing technology, tolerances and/or the like may be expected. Therefore, herein, the embodiments should not be explained to be limited to particular shapes of regions herein, but instead, comprise shape deviations caused by manufacturing and the like. For example, regions that are shown or described to be flat may usually have rough and/or nonlinear features. In addition, a shown acute angle may be rounded. Therefore, regions in the drawings are essentially schematic, and shapes of the regions are not intended to show precise shapes of the regions and are not intended to limit the scope of the claims.

The present disclosure will now be described hereinafter in details with reference to the accompanying drawings, in which exemplary embodiments of the disclosure are shown. Whenever possible, identical reference numerals refer to identical or like elements in the drawings and descriptions.

Figure 2:
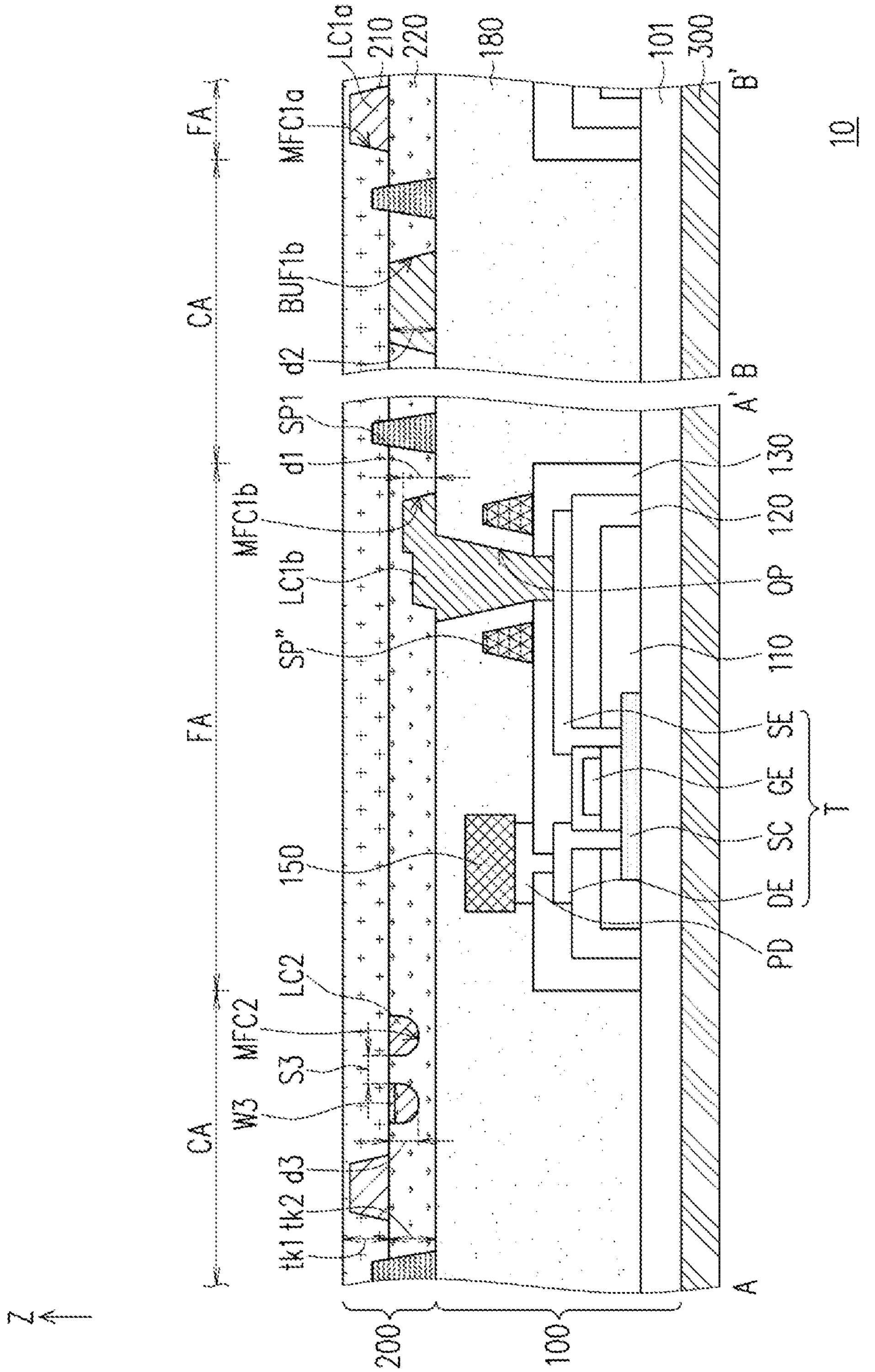
FIG. 2 and FIG. 3 are respectively sectional schematic views of the electronic apparatus of FIG. 1 at different locations.
Figure 3:
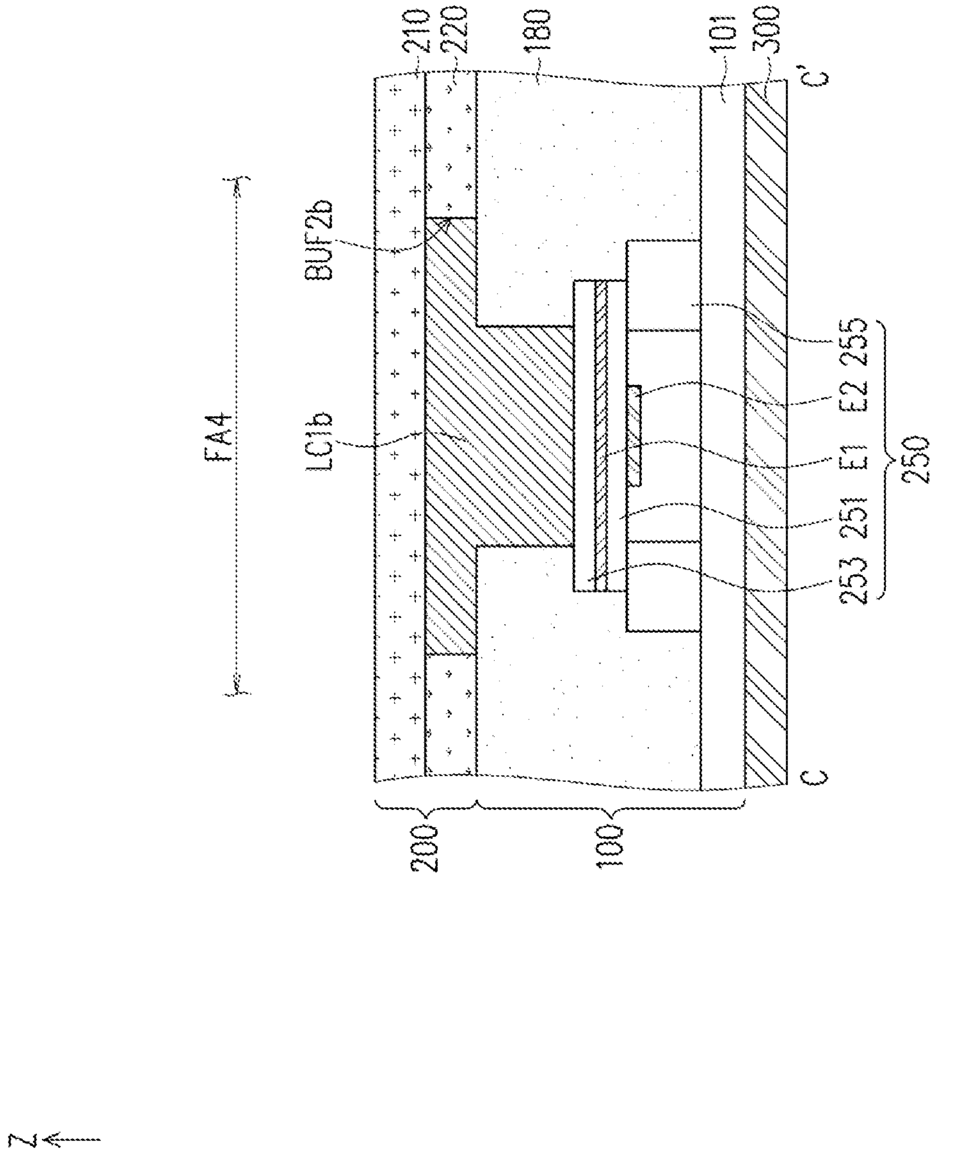

FIG. 1 is a top schematic view of an electronic apparatus according to a first embodiment of the present disclosure. FIG. 2 and FIG. 3 are respectively sectional schematic views of the electronic apparatus of FIG. 1 at different locations. FIG. 4A to FIG. 4I are sectional schematic views of a manufacturing process of the electronic apparatus of FIG. 1. FIG. 2 corresponds to the sectional line A-A' and the sectional line B-B' of FIG. 1. FIG. 3 corresponds to the sectional line C-C' of FIG. 1. For clarity, FIG. 1 illustrates only the substrate 101, the first microfluidic channel MFC1a, the first microfluidic channels MFC1b, the second microfluidic channels MFC2, the active components T, the light emitting components 150, the first spacers SP1, the buffer bag BUF1a, the first liquid conductor LC1a, the first liquid conductor LC1b and the second liquid conductor LC2 of FIG. 2, and the buffer bag BUF2a of FIG. 3.

Referring to FIG. 1 and FIG. 2, the electronic apparatus 10 includes a component layer 100. The component layer 100 has a plurality of functional areas FA separated from each other and a connection area CA outside the functional areas FA, and includes a plurality of electronic components. The electronic components are disposed in at least some of the functional areas FA. In the present embodiment, the electronic components include, for example, a plurality of light emitting components 150 and a plurality of active components T, in which the light emitting components 150 are, for example, micro light emitting diodes (micro-LEDs) or mini-LEDs. More specifically, the electronic apparatus 10 in the present embodiment may be a LED display panel, but is not limited thereto.

For example, in the present embodiment, each functional area FA may be disposed with a light emitting component 150 and an active component T (such as a driving transistor) electrically connected to each other, a capacitor not illustrated (such as a storage capacitor) and another active component not illustrated (such as a switch transistor), thus forming a driving circuit having the 2T1C structure in the functional area FA to control the light emitting component 150, but is not limited thereto.

In detail, the forming steps of the active component T include, for example: sequentially forming a semiconductor pattern SC, a gate insulating layer 110, a gate electrode GE, an insulating layer 120, a source electrode SE and a drain electrode DE, and an insulating layer 130 on a substrate 101, where the source electrode SE and the drain electrode DE penetrate through the gate insulating layer 110 and the insulating layer 120 to be electrically connected to two different areas of the semiconductor pattern SC respectively. In the present embodiment, the substrate 101 may be a flexible substrate made of polymers (such as polyimide PI, polycarbonate PC, or polymethyl methacrylate PMMA, without being limited thereto).

In the present embodiment, the gate electrode may be selectively disposed above the semiconductor pattern SC to form a top-gate thin-film transistor (TFT), but is not limited thereto. According to other embodiments not illustrated, the gate electrode GE of the active component may also be disposed below the semiconductor pattern SC to form a bottom-gate TFT. On the other hand, the material of the semiconductor pattern SC of the present embodiment may be a polysilicon semiconductor material, that is, the active component T may be a low temperature polysilicon (LTPS) TFT. However, the present disclosure is not limited thereto. In other embodiments, the active component may be an amorphous silicon (a-Si) TFT, a micro-Si TFT, a metal oxide transistor, a nitride semiconductor, an organic semiconductor, or a combination thereof, or other suitable materials.

It should be noted that the gate electrode GE, the source electrode SE, the drain electrode DE, the gate insulating layer 110, the insulating layer 120 and the insulating layer 130 may be respectively facilitated by any gate electrode, any source electrode, any drain electrode, any gate insulating layer and any insulating layer known by one of ordinary skill in the art to be used in a display panel, and the gate electrode GE, the source electrode SE, the drain electrode DE, the gate insulating layer 110, the insulating layer 120 and the insulating layer 130 may be respectively formed by any method known by one of ordinary skill in the art, without being hereinafter elaborated.

Further, the component layer 100 further includes a plurality of pads PD disposed on the insulating layer 130. The pads PD penetrate the insulating layer 130 to be electrically connected to the drain electrode DE of the active component T, and the light emitting component 150 is electrically coupled to the pads PD. It should be particularly noted that the quantity of the pads PD to be coupled to the light emitting component 150 may be determined by the structural type of the light emitting component 150, without being limited to the contents disclosed in the drawings. For example, if the light emitting component 150 is a vertical light emitting component, the quantity of the pad PD may be one; and if the light emitting component 150 is a flip-chip light emitting component, the quantity of the pads PD may be two.

After the light emitting component 150 is coupled to the corresponding pads PD, a flat layer 180 covering the active component T and the light emitting component 150 is formed. In the present embodiment, the flat layer 180 is made of a stretchable photoresist material (such as the commonly used SU8 series photoresist material).

It should be particularly noted that, in the present embodiment, all film layers forming the active components T may be stacked to form a plurality of island-shaped structures separated structurally. From another perspective, the island-shaped structures may be defined as the functional areas FA of the component layer 100, and the area outside the island-shaped structures may be defined as the connection area CA of the component layer 100.

To transmit the electrical signals to the functional areas FA, the electronic apparatus 10 further includes a channel layer 200 disposed on the component layer 100. The channel layer 200 is, for example, disposed to overlap with the component layer 100 along a direction Z. It should be noted that, unless specifically mentioned otherwise, the overlapping relationship between the two structural members is defined identically, and the overlapping direction is not further reiterated.

In the present embodiment, the channel layer 200 may include a plurality of first microfluidic channels MFC1a and a plurality of first microfluidic channels MFC1b. For example, the first microfluidic channels MFC1a may be arranged along a direction X and extend in a direction Y, and the first microfluidic channels MFC1b may be arranged along the direction Y and extend in the direction X, where the direction X may be selectively perpendicular to the direction Y, without being limited thereto. More specifically, normal projections of the first microfluidic channels MFC1a onto the substrate 101 and normal projections of the first microfluidic channels MFC1b onto the substrate 101 intersect with each other and define a plurality of pixel areas. Each pixel area may be provided with at least three light emitting components 150 and three active components T, and the three light emitting components 150 in each pixel area may be used to respectively emit light in three different colors, such as red light, green light and blue light, without being limited thereto.

The first microfluidic channels MFC1a and the first microfluidic channels MFC1b are respectively filled with a first liquid conductor LC1a and a first liquid conductor LC1b. The liquid conductors may be, for example, liquid metals made of at least two of gallium, indium, tin, copper, etc. Preferably, the viscosity coefficient of the liquid conductors may be greater than or equal to 1.1 mPa·s and less than or equal to 2.1 mPa·s.

For example, the first microfluidic channels MFC1a may extend through the functional areas FA arranged along the direction Y, and the first liquid conductor LC1a filled in the first microfluidic channels MFC1a may be electrically connected to the source electrode or the gate electrode of each switch transistor (that is, the active component not illustrated) in the functional areas FA. The first microfluidic channels MFC1b may extend through the functional areas FA arranged along the direction X, and the first liquid conductor LC1b filled in the first microfluidic channels MFC1b may be electrically connected to the source electrode SE of each active component T in the functional areas FA. That is, the combination of the first microfluidic channels MFC1a and the first liquid conductor LC1a may be, for example, the data lines used to transmit display data for determining the brightness of the emitted light of the light emitting components 150 or the gate lines used to transmit control signals of the switch transistors, and the combination of the first microfluidic channels MFC1b and the first liquid conductor LC1b may be, for example, the power lines used to transmit driving currents for driving the light emitting components 150 to emit light, without being limited thereto. In other embodiments, the combination of the first microfluidic channels extending in any direction (such as the direction X or the direction Y) and the first liquid conductor therein may be any of the data lines, the gate lines and the power lines.

From another perspective, the channel layer 200 may include a first stretchable layer 210 and a second stretchable layer 220 stacked with each other, where the second stretchable layer 220 is located between the component layer 100 and the first stretchable layer 210. In the present embodiment, the first microfluidic channels MFC1a are disposed in the first stretchable layer 210, and the first microfluidic channels MFC1b are disposed in the second stretchable layer 220. It should be particularly noted that the insulating layer 130 and the flat layer 180 of the component layer 100 are provided with openings OP exposing the drain electrodes DE of the active components T, and the openings OP are in communication with the first microfluidic channels MFC1b of the channel layer 200. Thus, the first liquid conductor LC1b filled in the first microfluidic channels MFC1b may fill in the openings OP of the component layer 100, and thus are electrically contacted to the source electrodes SE of the active components T.

The first microfluidic channels have a depth (such as the first depth d1 in FIG. 2) in the overlapping direction of the component layer 100 and the channel layer 200 (such as the direction Z), and have a width (such as the first width W1 in FIG. 1) in a direction perpendicular to the extending direction of the first microfluidic channels. The width of the first microfluidic channels may be greater than or equal to 20 μm and less than or equal to 100 μm, and the depth of the first microfluidic channels may be greater than or equal to 5 μm and less than or equal to 1 mm. Preferably, a ratio of the depth to the width (that is, the depth-width ratio) of the first microfluidic channels may be greater than or equal to 0.5 and less than or equal to 10. On the other hand, a spacing between two adjacent first microfluidic channels (such as the spacing S1 and the spacing S2 in FIG. 1) may be greater than or equal to 10 μm and less than or equal to 200 μm.

The thicknesses of the first stretchable layer 210 and the second stretchable layer 220 respectively along the direction Z (such as the thickness tk1 and the thickness tk2) may be greater than or equal to 10 μm and less than or equal to 2000 μm, and may be preferably greater than or equal to 10 μm and less than or equal to 500 μm. The material of the first stretchable layer 210 and the second stretchable layer 220 may include, for example, thermoplastic polyurethane (TPU) elastomers, polydimethylsiloxane (PDMS), a photoresist material (such as SU8), or stretchable polymer materials with a Young's Modulus ranging from 0.1 MPa to 1 GPa, and preferably ranging from 0.5 MPa to 50 MPa. On the other hand, the material of the island-shaped structures provided with the active components T and the light emitting components 150 may have a Young's Modulus ranging from 1 GPa to 100 GPa. Thus, in the stretching process of the electronic apparatus 10, the elongation of the connection area CA is significantly greater than the elongation of the functional areas FA. That is, most of the deformation of the stretching process is concentrated in the connection area CA.

To enhance the provision density of the functional areas FA (such as the pixel resolution), the first microfluidic channels in the present embodiment adopt a linear design. In the stretching process of the electronic apparatus 10, the portions of the first microfluidic channels and the first liquid conductor in the connection area CA will stretch correspondingly. To ensure that the electronic components in different functional areas FA still have good electrical connection relationship after the stretching of the electronic apparatus 10, the first microfluidic channels is provided with at least one buffer bag in the connection area CA. The provision of the buffer bag may increase the sectional area of each microfluidic channel in a direction perpendicular to the extending direction thereof to reduce the overall initial impedance, and to effectively suppress the increase of the overall impedance thereof after stretching the first microfluidic channels.

For example, the first microfluidic channels MFC1a extending in the direction Y are provided with the buffer bag BUF1a in the connection area CA, and the first microfluidic channels MFC1b extending in the direction X are provided with the buffer bag BUF1b in the connection area CA. In the direction perpendicular to the extending direction (such as the direction X) of the first microfluidic channels (such as the first microfluidic channels MFC1b), the first microfluidic channels have a first width (such as the first width W1), the buffer bag (such as the buffer bag BUF1b) has a second width (such as the second width W2), and a ratio of the second width to the first width may be greater than 1 and less than or equal to 5. On the other hand, in the overlapping direction of the component layer 100 and the channel layer 200 (such as the direction Z), the first microfluidic channels have a first depth (such as the first depth d1), the buffer bag (such as the buffer bag BUF1b) has a second depth (such as the second depth d2), and a ratio of the second depth to the first depth may be greater than 1 and less than or equal to 10.

When the electronic apparatus 10 is stretched along, for example, the direction X or the direction Y, the length of the first microfluidic channels in the connection area CA will increase correspondingly. Since the buffer bags located in the connection area CA (such as the buffer bag BUF1a and buffer bag BUF1b) have greater widths and depths than the first microfluidic channels located in the functional areas FA (such as the first microfluidic channels MFC1a and the first microfluidic channels MFC1b), the first liquid conductor in the buffer bags located in the connection area CA may be timely filled in the space increased by the stretching of the first microfluidic channels, thereby avoiding the first liquid conductor from generating cracks in the stretched first microfluidic channels and affecting the conductivity thereof.

To avoid the first microfluidic channels from closing in the stretching process or in the mating process of the component layer 100 and the channel layer 200, the electronic apparatus 10 is further provided with a plurality of first spacers SP1 in the connection area CA, and the first spacers SP1 are arranged at intervals on at least one side of each of the first microfluidic channels. The material of the first spacers SP1 includes, for example, polymer materials, metals or inorganic materials, without being limited thereto. A ratio of the Young's Modulus of the first spacers SP1 to the Young's Modulus of the first stretchable layer 210 and the second stretchable layer 220 is greater than 100. In the present embodiment, the first spacers SP1 may extend in the first stretchable layer 210 and the second stretchable layer 220, but is not limited thereto.

Further, the channel layer 200 further includes a plurality of second microfluidic channels MFC2, and a second liquid conductor LC2 is filled in the second microfluidic channels MFC2. In the present embodiment, the second microfluidic channels MFC2 are provided between the first stretchable layer 210 and the second stretchable layer 220. It should be particularly noted that the second microfluidic channels MFC2 only extend between two adjacent functional areas FA, without extending to the third functional area FA. For example, a first functional area FA1 and a second functional area FA2 adjacent to each other along the direction X and arranged at an interval are respectively provided with a first active component T1 and a second active component T2, and a second microfluidic channel MFC2 is in communication between the first active component T1 and the second active component T2, where the second liquid conductor LC2 filled in the second microfluidic channel MFC2 is electrically connected to the first active component T1 and the second active component T2, without being limited thereto. In other embodiments, the second liquid conductor LC2 filled in the second microfluidic channel MFC2 may be used to be electrically connected to any electronic components in the two adjacent functional areas FA.

The second microfluidic channels MFC2 have a depth d3 in the overlapping direction of the component layer 100 and the channel layer 200 (such as the direction Z), and have a width W3 in a direction perpendicular to an extending direction of the second microfluidic channels MFC2. The width W3 of the second microfluidic channels MFC2 may be greater than or equal to 1 μm and less than or equal to 20 μm, and the depth d3 of the second microfluidic channels MFC2 may be greater than or equal to 0.2 μm and less than or equal to 20 μm. Preferably, a ratio of the depth d3 to the width W3

(that is, the depth-width ratio) of the second microfluidic channels MFC2 may be greater than or equal to 0.2 and less than or equal to 1. On the other hand, a spacing S3 between any two adjacent second microfluidic channels MFC2 may be greater than or equal to 5 μm and less than or equal to 100 μm.

Referring to FIG. 1 and FIG. 3, in the present embodiment, some of the functional areas of the electronic apparatus 10 may be provided with buffer bags. For example, the functional area FA3 may be provided with a buffer bag BUF2a in communication with the first microfluidic channels MFC1a, and the functional area FA4 may be provided with a buffer bag BUF2b in communication with the first microfluidic channels MFC1b. It should be particularly noted that, when the first liquid conductor flows in the first microfluidic channels, the viscosity thereof leads to a hydraulic drop in the first microfluidic channels. To compensate for the dynamic pressure drop generated by the flow of the first liquid conductor in the first microfluidic channels, the component layer 100 may also be provided with a micropump structure 250 in communication with the buffer bag BUF2b, without being limited thereto.

In other words, by providing the micropump structure, the first liquid conductor may be allowed to flow with sufficient power in the first microfluidic channels with a narrow linewidth. It should be noted that the present disclosure is not limited to the contents disclosed in the drawings, and the quantity and distribution of the buffer bags (or the micropump structure 250) may be adjusted according to the actual requirements (such as the electrical requirements). On the other hand, when the first liquid conductor filled in the first microfluidic channels generates cracks or breaks in the connection area CA after the stretching of the electronic apparatus 10, the micropump structure 250 may operate to perform degassing or refilling, thus repairing the first liquid conductor which functions as the conductive line.

In the present embodiment, the micropump structure 250 may be, for example, a piezoelectric micromachined ultrasonic transducer (PMUT), and may include a piezoelectric layer 251, a first electrode E1, a second electrode E2, a wafer layer 253 and a supporting wall 255. The material of the first electrode E1 may be, for example, aluminum, the material of the second electrode E2 may be, for example, molybdenum, the material of the piezoelectric layer 251 may be, for example, aluminum nitride (AlN), the wafer layer 253 may be, for example, a silicon wafer, and the material of the supporting wall 255 may be, for example, silicon dioxide ($SiO_2$). Under the drive of positive and negative voltages applied to the two electrodes, the film surface of the piezoelectric layer 251 undergoes deformation and reciprocates along the direction Z, thus generating a force capable of driving the first liquid conductor to flow in the first microfluidic channels.

However, the present disclosure is not limited thereto. In other embodiments, the micropump structure may be a silicon piezoelectric micropump, an ionic polymer-metal composites (IPMC) piezoelectric polymer micropump, or an electroactive polymers (EAPs) micropump, etc.

On the other hand, to give the first liquid conductor a unidirectional flow direction in the first microfluidic channels, a segment connected to the buffer bag in each first microfluidic channel may be provided with a Tesla valve.

Since the flat layer 180 of the component layer 100 is made of a stretchable photoresist material, in order to avoid damage to the openings OP of the component layer 100 in the mating process of the component layer 100 and the channel layer 200 that affects the subsequent electrical connection of the liquid conductor and the source SE of the active component T, the component layer 100 may be provided with a plurality of spacers SP" at two opposite sides of each opening OP (as shown in FIG. 2), and the spacers SP" are disposed on the insulating layer 130, without being limited thereto.

The method of fabricating the electronic apparatus 10 will be exemplarily described as follows.

Figure 4A:
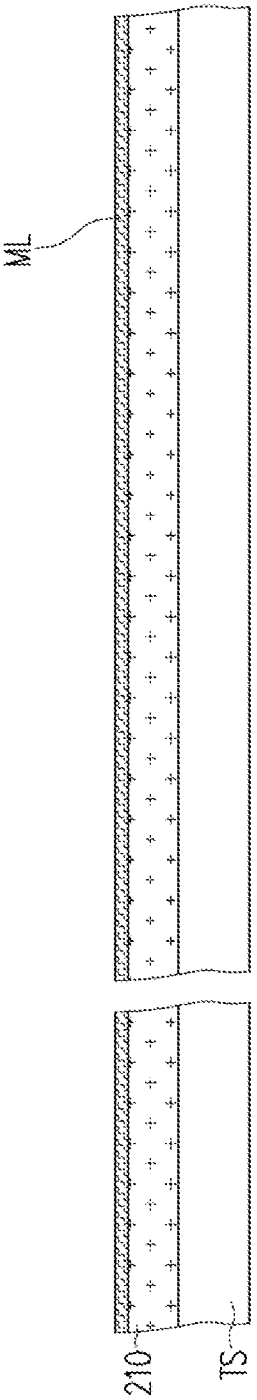
FIG. 4A to FIG. 4I are sectional schematic views of a manufacturing process of the electronic apparatus of FIG. 1.
Figure 4B:
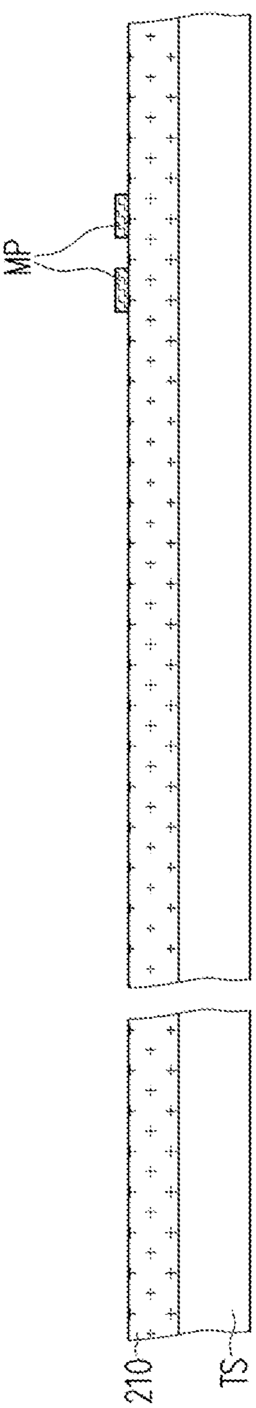

Referring to FIG. 4A, firstly, a first stretchable layer 210 and a metal layer ML are sequentially formed on a temporary substrate TS. A patterning process is performed to the metal layer ML to form a plurality of metal patterns MP, as shown in FIG. 4B. The patterning process herein may be, for example, photolithography and etching processes, without being not limited thereto.

Figure 4C:
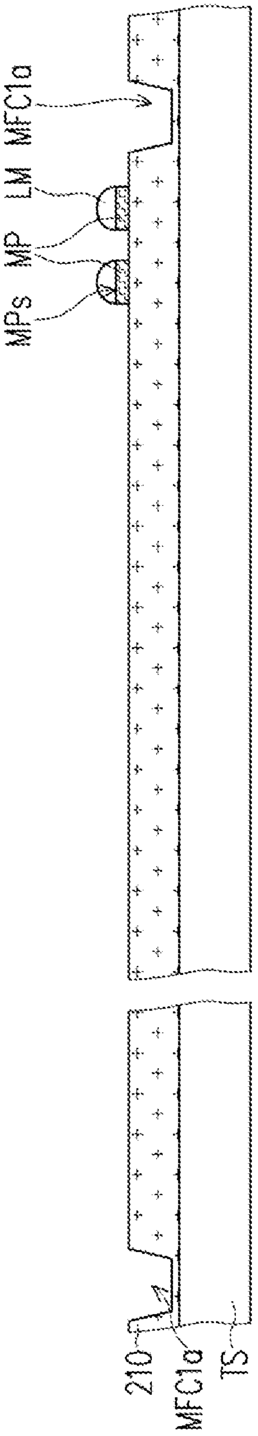

Referring to FIG. 4C, a first micromachining process is performed to the first stretchable layer 210 to form the first microfluidic channels MFC1a, where the first micromachining process may be a laser micromachining process, without being limited thereto. In addition, a corrosive process is performed to the metal patterns MP to form a liquid conductor, where the step of the corrosive process may include forming a liquid metal LM on the surface MPs of the metal patterns MP. In the process, the metal patterns MP may be corroded by the liquid metal LM and transform into fragmented segments or a liquid metal alloy, ultimately forming a second liquid conductor LC2.

For example, in the present embodiment, the forming step of the first microfluidic channels MFC1a may be performed prior to the corrosive process of the metal patterns MP. To avoid contamination of the previously formed first microfluidic channels MFC1a by the coating of the liquid metal LM in the corrosive process, the coating of the liquid metal LM may adopt the inkjet printing (IJP) technology, along with the FINE PITCH METAL (photolithography) technology. However, the present disclosure is not limited thereto. In other embodiments, considering different coating methods of the liquid metal LM, the forming of the first microfluidic channels MFC1a may be performed after the corrosive process of the metal patterns MP.

Figure 4D:
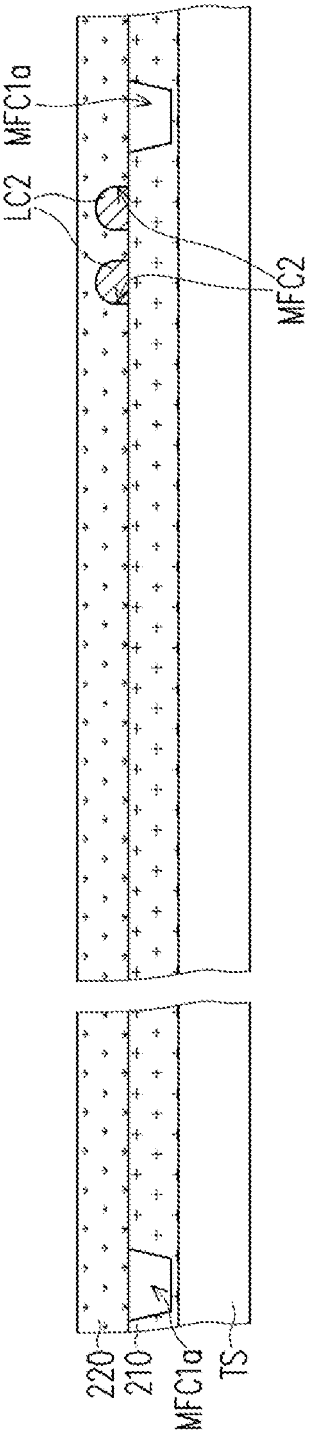

Referring to FIG. 4D, after the completion of the forming step of the second liquid conductor LC2, a low temperature attaching process of a second stretchable layer 220 is performed on the first stretchable layer 210, where the second stretchable layer 220 covers the second liquid conductor LC2. For example, in the present embodiment, the melting point of the second liquid conductor LC2 is, for example, 20° C. Thus, to avoid the second liquid conductor LC2 from being pressed in the attaching process of the second stretchable layer 220 and overflowing from a predetermined location, it is required to control a processing temperature of the attaching process to be lower than 20° C., such that the second liquid conductor LC2 transforms from the liquid state to the solid state. Preferably, the processing temperature of the attaching process may be controlled within a temperature range of 5° C. to 15° C., thus avoiding excessively affecting the characteristics of the adhesive material.

Figure 4E:
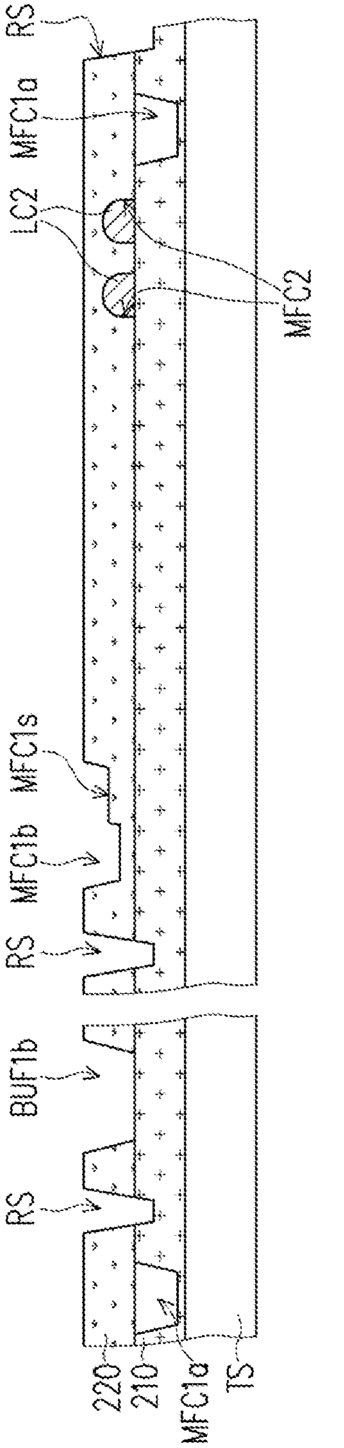

Since the attaching process is performed in the low temperature environment, the distributed location and width of the second microfluidic channel MFC2 defined by the solid-state second liquid conductor LC2 in the second stretchable layer 220 are substantially identical to the distributed location and width of the metal patterns MP in FIG. 4B. Referring to FIG. 4E, subsequently, a second micromachining process is performed to the first stretchable layer 210 and the second stretchable layer 220 to form the other first microfluidic channels MFC1b, the buffer bag BUF1b and a plurality of recesses RS, where the recesses RS are disposed on at least one side of the first microfluidic channels MFC1a or the first microfluidic channels MFC1b. The second micromachining process may be, for example, a laser micromachining process, without being limited thereto.

In the present embodiment, the second micromachining process may further include forming side microfluidic channels MFC1s, and the side microfluidic channels MFC1s are in communication with the first microfluidic channels MFC1b. It should be particularly noted that, unlike the first microfluidic channels MFC1b, the buffer bag BUF1b and the side microfluidic channels MFC1s that are formed in the second stretchable layer 220, the recesses RS are formed in the first stretchable layer 210 and the second stretchable layer 220.

Figure 4F:
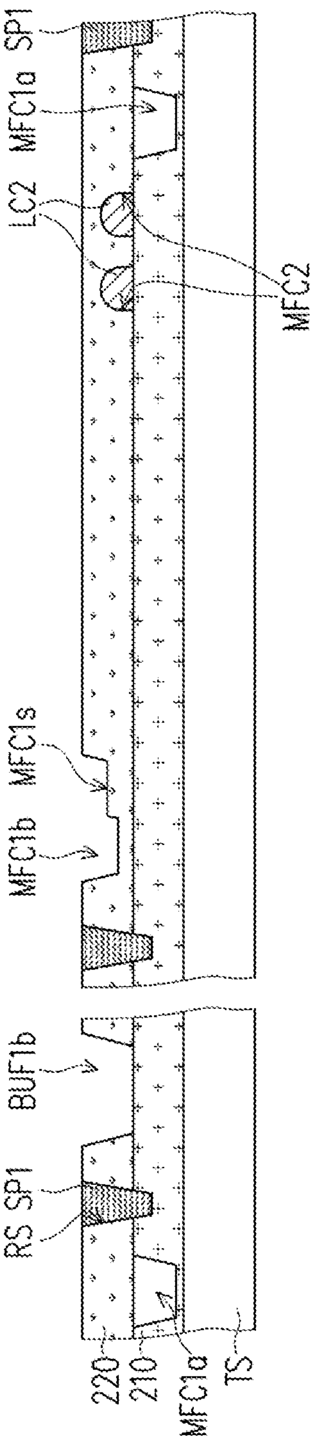

Referring to FIG. 4F, after the completion of manufacturing the recesses RS, a plurality of spacers SP1 are formed in the recesses RS. In the present embodiment, the forming method of the spacers SP1 includes, for example, jetting, screen printing, inkjet printing or offset printing.

Figure 4G:
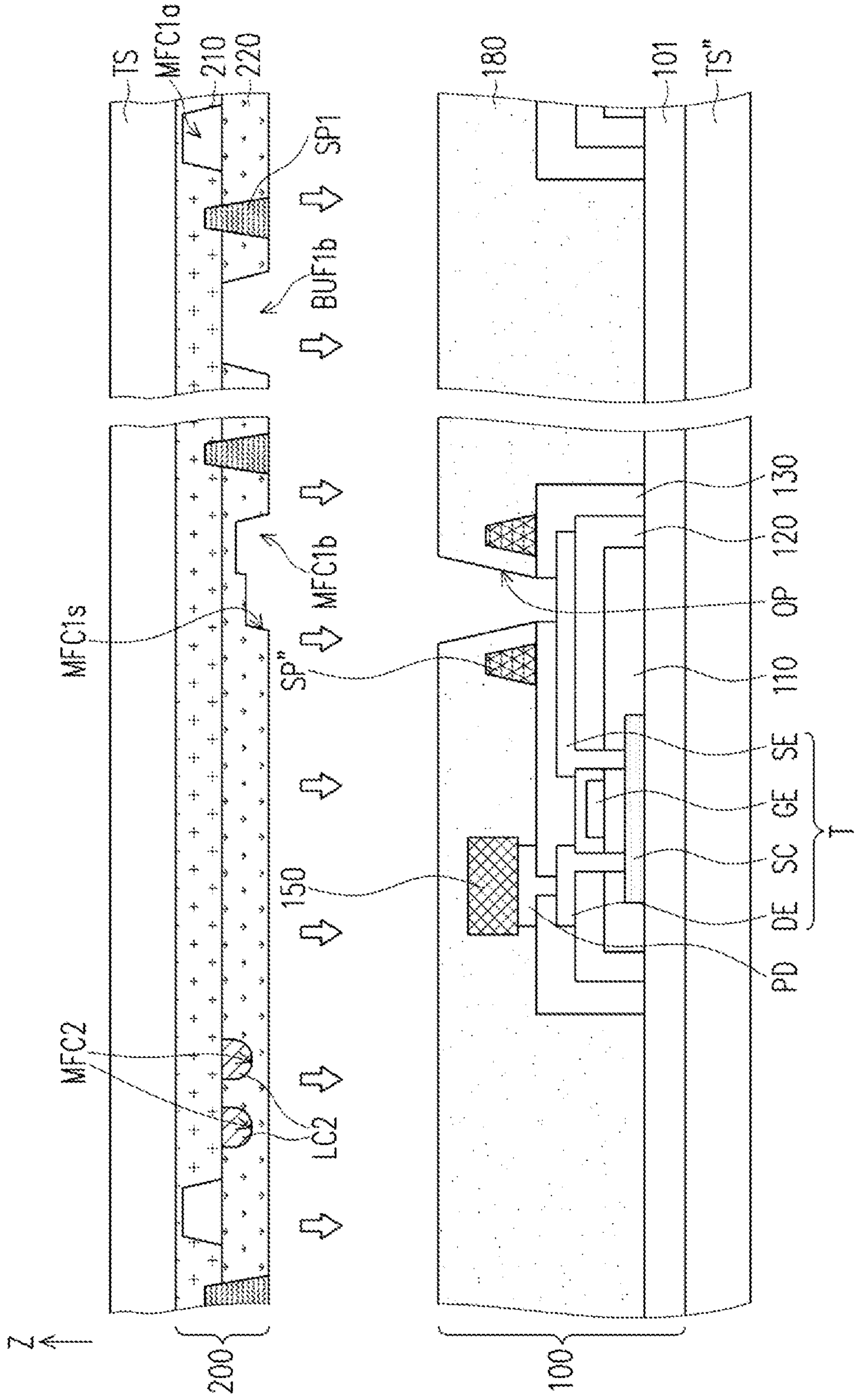
Figure 4H:
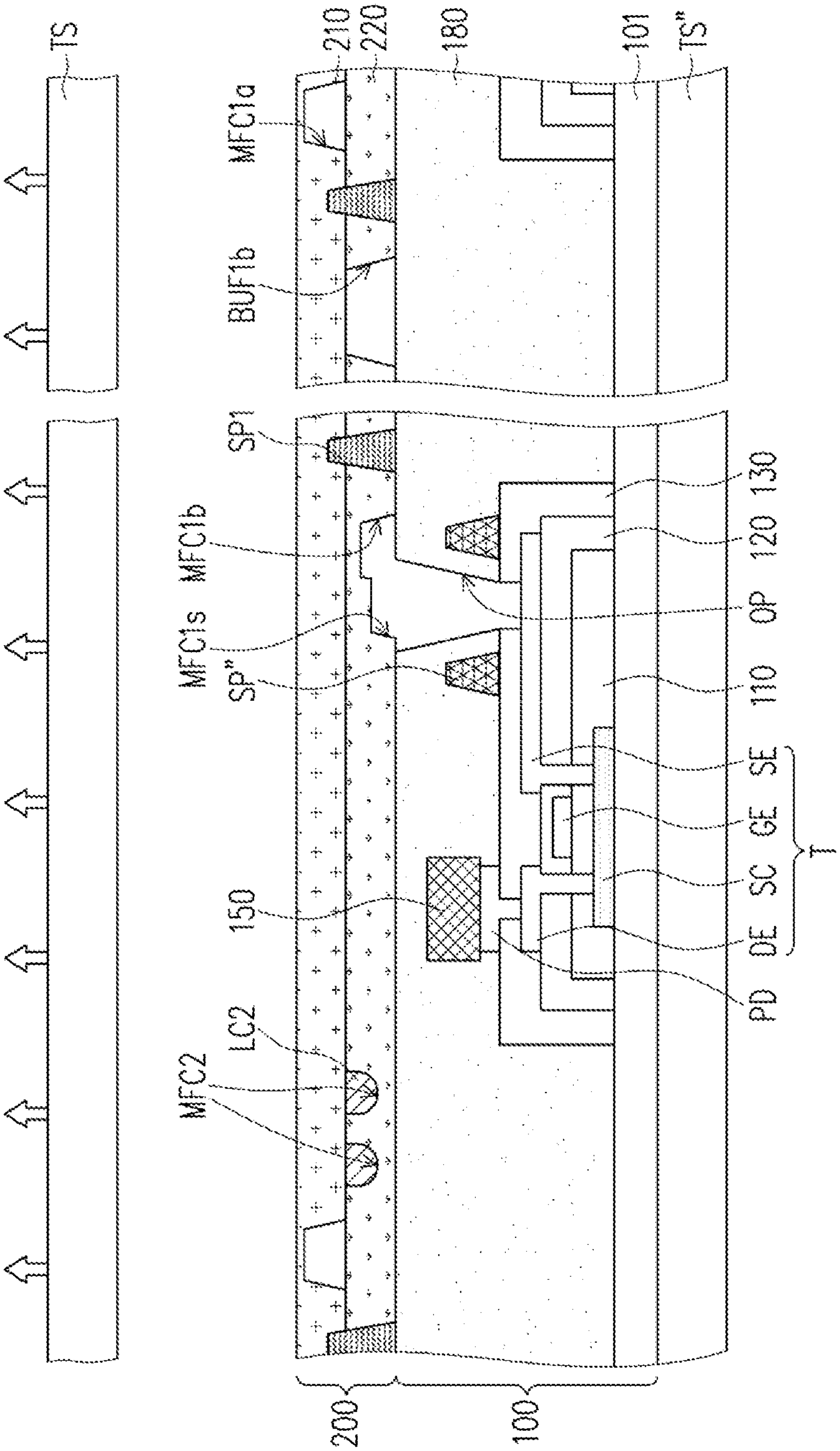

Referring to FIG. 4G and FIG. 4H, subsequently, the component layer 100 is provided, and a mating process of the component layer 100 and the channel layer 200 is performed, where the first microfluidic channels MFC1b of the channel layer 200 may be in communication with the openings OP in the component layer 100 through the side microfluidic channels MFC1s. After the completion of the mating process of the component layer 100 and the channel layer 200, the temporary substrate TS is removed.

Figure 4I:
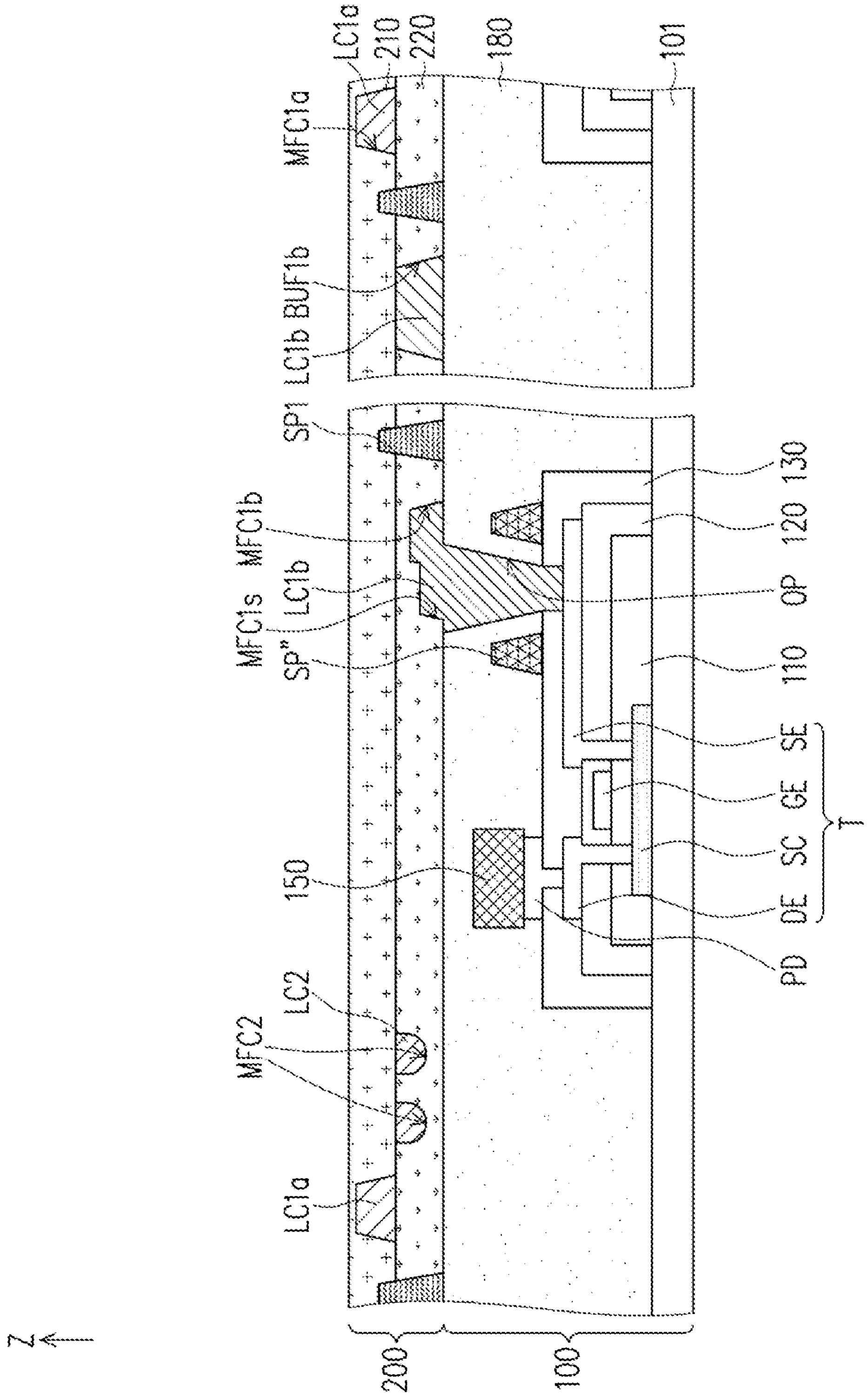

Referring to FIG. 4I, subsequently, a filling step of the first liquid conductor in the first microfluidic channels is performed. For example, the first microfluidic channels may be in communication with external buffer bags and micropumps, and the first liquid conductor may be filled by pumping drainage, without being limited thereto. The first microfluidic channels may also be filled with the first liquid conductor by heating drainage or vacuum drainage. It should be particularly noted that, in the injecting process of the first liquid conductor, the buffer bags and the micropump structures 250 disposed in the functional areas FA (as shown in FIG. 3) may also provide the drainage functions.

It should be particularly noted that, due to the different design requirements for the widths or depths of the first microfluidic channels and the second microfluidic channels, different manufacturing processes will be adopted for production thereof. That is, the manufacturing processes of the microfluidic channels may be different based on the design of the channel sizes thereof. For example, in the present embodiment, the first microfluidic channels have a channel size that is sufficiently wide and sufficiently deep, and thus may be suitable for drainage to fill the liquid conductor therein. In contrast, the second microfluidic channels have a channel size that is relatively narrower and shallower, thus being unsuitable for drainage, and thereby must adopt the aforementioned coating and low temperature attaching processes.

Referring to FIG. 4I and FIG. 2, in the present embodiment, the method of fabricating the electronic apparatus 10 may further selectively include: after removing another temporary substrate TS" (as shown in FIG. 4H), forming a functional layer 300 on the surface of one side of the substrate 101 away from the active component T. The functional layer 300 is, for example, a film layer having functions such as heat dissipation or electromagnetic shielding, etc. At this point, the fabrication of the electronic apparatus is completed.

Referring to FIG. 1 and FIG. 2, in the present embodiment, the electronic apparatus 10 includes a component layer 100 and a channel layer 200 overlapping with each other. The component layer 100 has a plurality of functional areas FA separated from each other and a connection area CA outside the functional areas FA. The component layer 100 includes a plurality of electronic components disposed in at least some of the functional areas FA. The channel layer 200 includes a first stretchable layer 210, a second stretchable layer 220, a plurality of first microfluidic channels and a first liquid conductor. The first microfluidic channels are disposed in at least one of the first stretchable layer 210 and the second stretchable layer 220, and extend through the functional areas FA. The first liquid conductor is filled in the first microfluidic channels and is electrically connected to at least some of the electronic components. Each first microfluidic channel is provided with at least one buffer bag in the connection area CA. By disposing the buffer bag in the connection area CA, when the microfluidic channels passing through the connection area CA are extended, the electrical connection between the first liquid conductor and the electronic components in different functional areas FA may be ensured, thus further ensuring both the stretchability and stability of the electrical signal transmission paths.

Certain other embodiments will be enumerated as follows to provide detailed descriptions of the present disclosure, in which identical components are identified by identical reference numerals, and descriptions of the identical technical contents will be omitted. The omitted descriptions may be referenced to in the aforementioned embodiment, and are not hereinafter reiterated.

Figure 5:
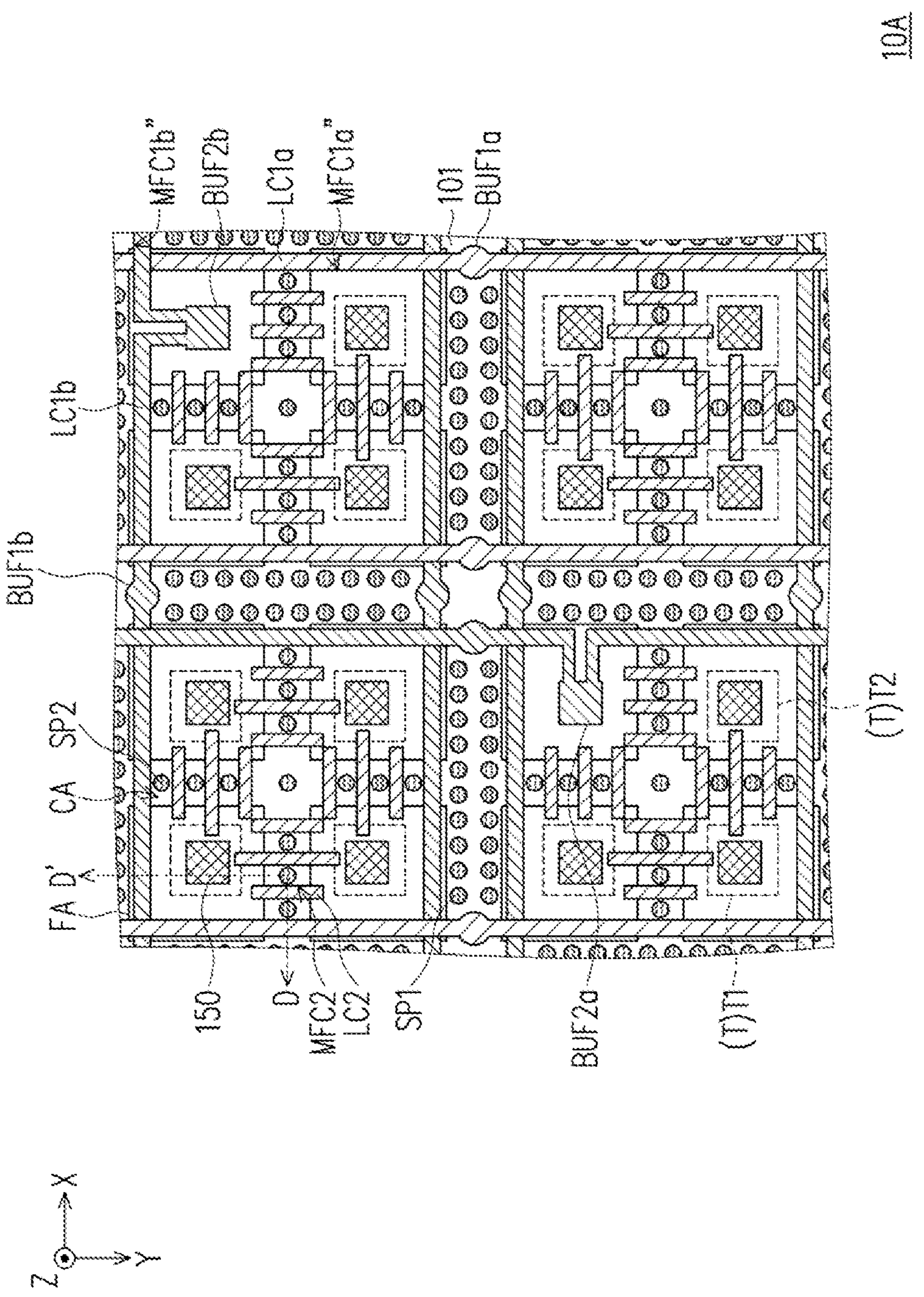
FIG. 5 is a top schematic view of an electronic apparatus according to a second embodiment of the present disclosure.
Figure 6:
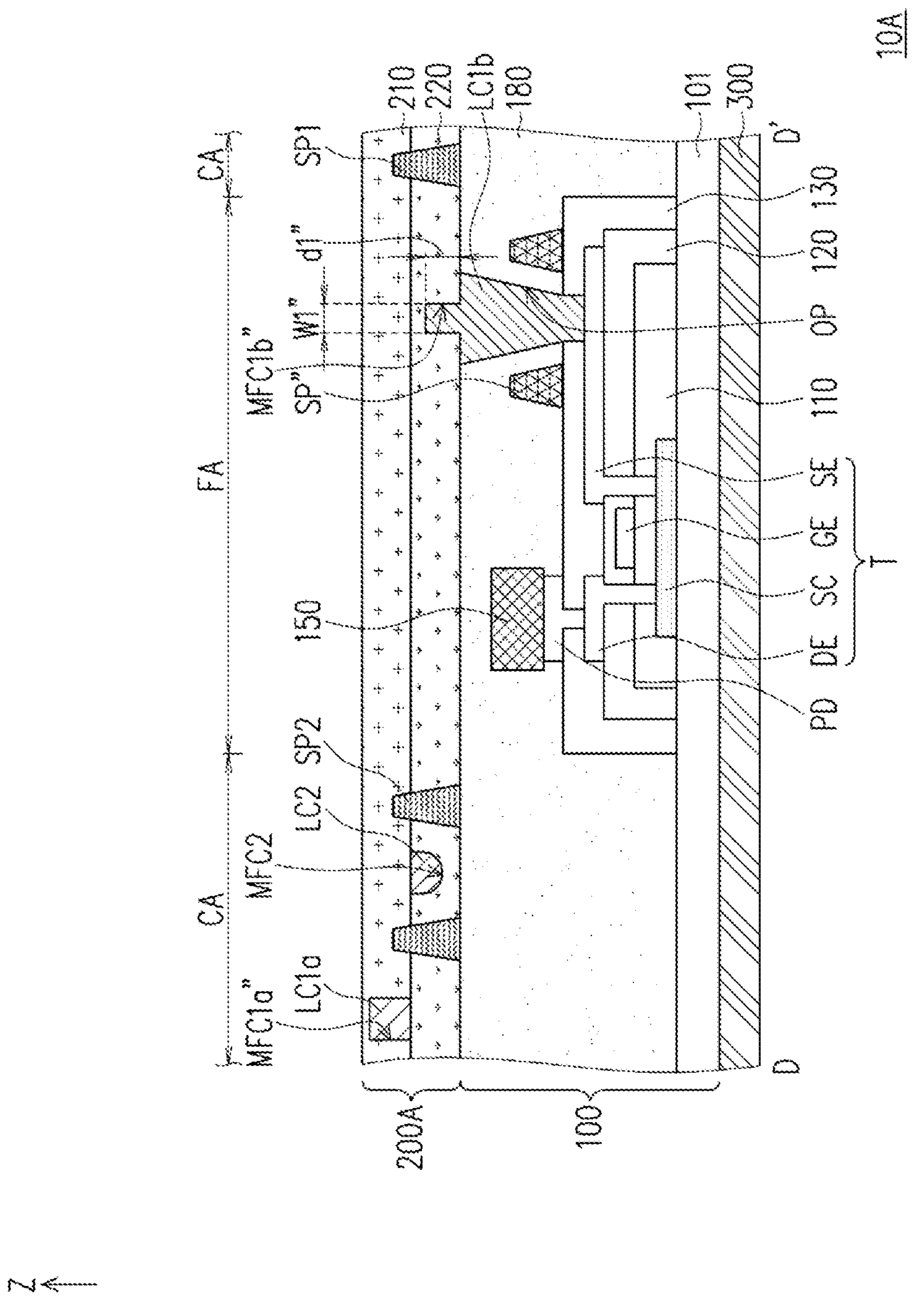
FIG. 6 is a sectional schematic view of the electronic apparatus of FIG. 5.

FIG. 5 is a top schematic view of an electronic apparatus according to a second embodiment of the present disclosure. FIG. 6 is a sectional schematic view of the electronic apparatus of FIG. 5. FIG. 6 corresponds to the sectional line D-D' of FIG. 5. For clarity, FIG. 5 illustrates only the substrate 101, the first microfluidic channels MFC1a, the first microfluidic channels MFC1b, the second microfluidic channels MFC2, the active components T, the light emitting components 150, the first spacers SP1, the second spacers SP2, the buffer bag BUF1a, the buffer bag BUF1b, the buffer bag BUF2a, the buffer bag BUF2b, the first liquid conductor LC1a, the first liquid conductor LC1b and the second liquid conductor LC2 of the electronic apparatus 10A.

Referring to FIG. 5 and FIG. 6, the difference of the electronic apparatus 10A in the present embodiment from the electronic apparatus 10 of FIG. 1 exists in that: the electronic apparatus 10A in the present embodiment is provided with at least one second spacer SP2 on at least one side of each second microfluidic channel MFC2. For example, in the present embodiment, each second microfluidic channel MFC2 is provided with two second spacers SP2 respectively at two opposite sides perpendicular to the extending direction thereof, thus avoiding the second microfluidic channel MFC2 from closing in the stretching process or in the mating process of the component layer 100 and the channel layer 200A. Since the material formation and the forming method of the second spacers SP2 are similar to the first spacers SP1 in the previous embodiment, the detailed descriptions of the second spacers SP2 may be referenced to the relevant paragraphs in the previous embodiment, and are thus not hereinafter further elaborated.

On the other hand, in the present embodiment, a normal projection contour of each first microfluidic channel extending in an extending direction on a cross-section perpendicular to the extending direction is rectangular. For example, the normal projection contour of each first microfluidic channel MFC1a" on a cross-section perpendicular to the direction Y and the normal projection contour of each first microfluidic channel MFC1b" on a cross-section perpendicular to the direction X are both rectangular. Preferably, a ratio (that is, a depth-width ratio) of a first depth of the first microfluidic channels (such as the first depth d1" of the first microfluidic channels MFC1b") to a first width thereof (such as the first width of the first microfluidic channels MFC1b") is greater than or equal to 3 and less than or equal to 5. Thus, the first liquid conductor may maintain a relatively thinner thickness and higher fluidity, which may help to reduce the quantity of the micropump structures.

Figure 7:
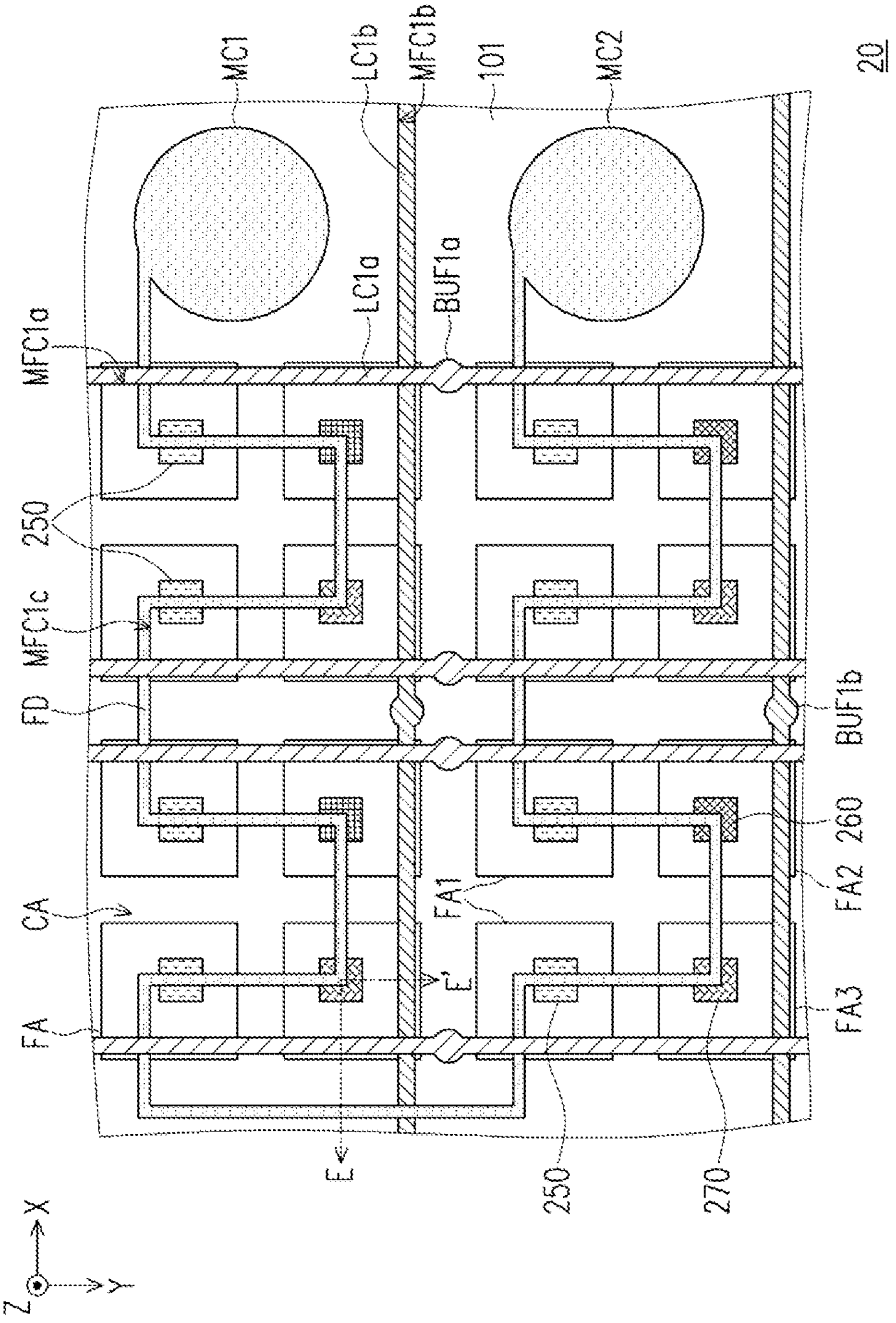
FIG. 7 is a top schematic view of an electronic apparatus according to a third embodiment of the present disclosure.
Figure 8:
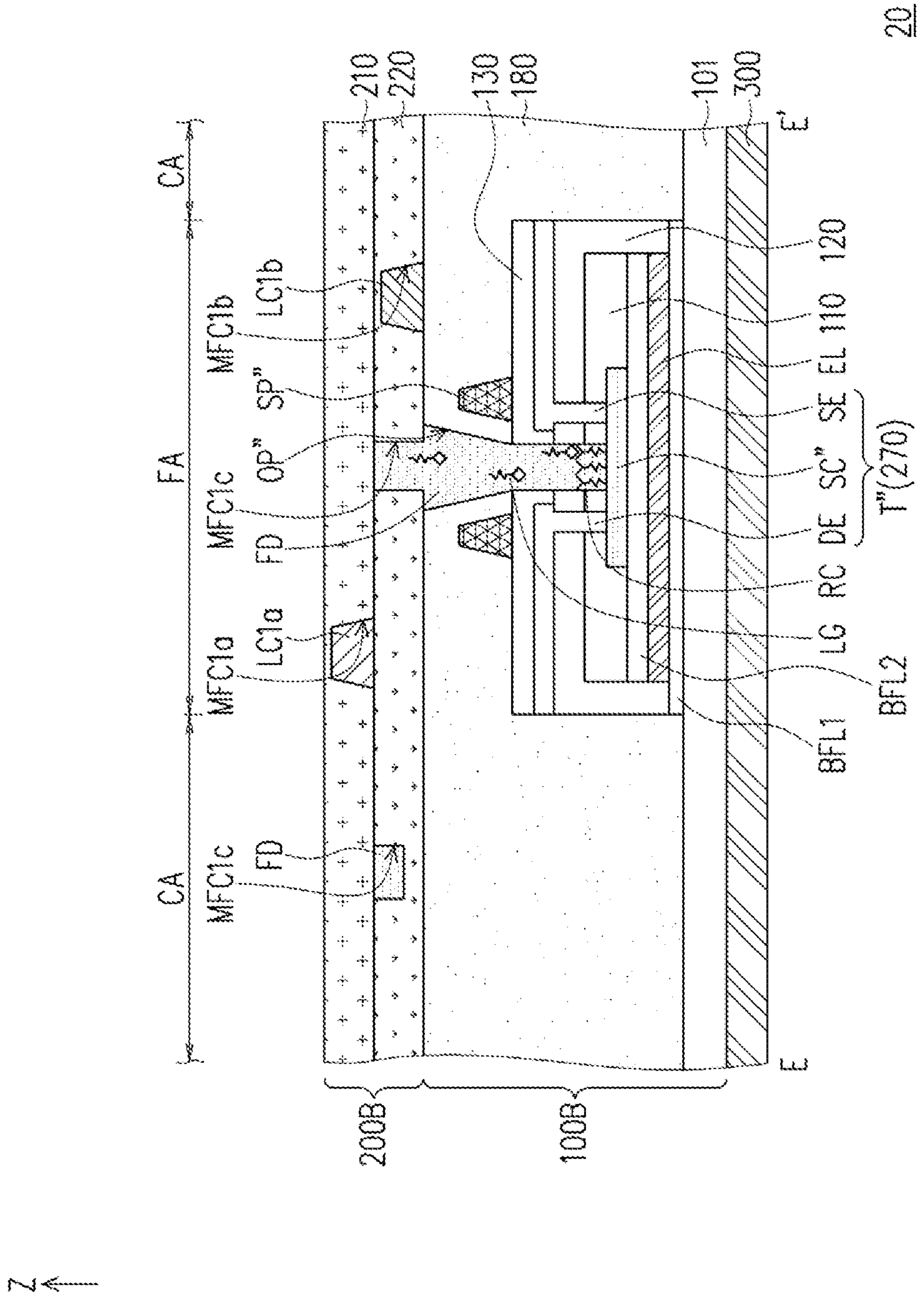
FIG. 8 is a sectional schematic view of the electronic apparatus of FIG. 7.

FIG. 7 is a top schematic view of an electronic apparatus according to a third embodiment of the present disclosure. FIG. 8 is a sectional schematic view of the electronic apparatus of FIG. 7. FIG. 8 corresponds to the sectional line E-E' of FIG. 7. For clarity, FIG. 7 omits the illustrations of the stretchable layer, the flat layer 180 and the functional layers 300 in FIG. 8.

Referring to FIG. 7 and FIG. 8, the difference of the electronic apparatus 20 in the present embodiment from the electronic apparatus 10 of FIG. 1 exists in that: the functionalities of the electronic apparatus are different. Specifically, unlike the electronic apparatus of FIG. 1, which is a display panel, in the present embodiment, the electronic apparatus 20 may be a biological detection chip. In detail, the functional areas FA of the electronic apparatus 20 may be divided into groups of four as a plurality of detection unit areas. For example, each detection unit area is provided with two first functional areas FA1, one second functional area FA2 and one third functional area FA3. Each of the two first functional areas FA1 may be provided with two micropump structures 250, the second functional area FA2 may be provided with a heater 260, and the third functional area FA3 may be provided with a detection component 270. Similar to the previous embodiments, each first microfluidic channel MFC1c is provided with a buffer bag (not illustrated) at the location of the micropump structure 250, and is in communication with the micropump structure 250. The segment of each first microfluidic channel MFC1c in communication with the buffer bag may be provided with a Tesla valve (not illustrated), such that a drainage direction of the first microfluidic channels MFC1c is unidirectional.

In the present embodiment, the detection component 270 may include an active component T", an electrode layer EL, a first buffer layer BFL1 and a second buffer layer BFL2. The electrode layer EL is disposed between the substrate 101 and the active component T". The first buffer layer BFL1 is disposed between the electrode layer EL and the substrate 101. The second buffer layer BFL2 is disposed between the active component T" and the electrode layer EL. It should be particularly noted that, in the present embodiment, each opening OP" of the component layer 100B penetrates through the flat layer 180, the insulating layer 130, the insulating layer 120 and the gate insulating layer 110, and exposes the semiconductor pattern SC" of the active component T". A surface of the semiconductor pattern SC" of the active components T" being exposed by the opening OP" may form a receptor layer RC used for biological detection.

In the present embodiment, the detection unit areas and the four functional areas FA within each detection unit area may be serially connected by a first microfluidic channel MFC1c, and the two ends of the first microfluidic channel MFC1c are respectively in communication with a microchamber MC1 and a microchamber MC2. A width of the first microfluidic channel MFCIc may be greater than or equal to 30 μm and less than or equal to 100 μm, and a ratio of the depth to the width (that is, the depth-width ratio) of the first microfluidic channel MFC1c may be greater than or equal to 1 and less than or equal to 5. Preferably, the width of the first microfluidic channel MFC1c may be greater than or equal to 50 μm and less than or equal to 100 μm, and the depth-width ratio of the first microfluidic channel MFC1c may be greater than or equal to 3 and less than or equal to 5, without being limited thereto. In another deformed embodiment, the depth-width ratio of the first microfluidic channel MFC1c may be greater than 5 if the overall thickness of the biological detection chip is not taken into account.

For example, the fluid to be detected FD may be injected into the first microfluidic channel MFC1c through the microchamber MC2, and with the assistance of the micropump structures 250, the fluid to be detected FD is guided toward the microchamber MC1. The fluid to be detected FD may have a plurality of ligands LG, and at least some of the ligands LG in the third functional area FA3 bind with the receptors RC of the detection component 270 and generate sensing signals. Prior to entering the detection component 270, the fluid to be detected FD may undergo pre-processing in the second functional area FA2, such as heating or performing time-delay control, and after the completion of a reaction time interval, it may then proceed to the next stage or the next channel.

In the present embodiment, the configurations of the first microfluidic channels MFC1a and the first microfluidic channels MFC1b as well as the connection between the first microfluidic channels MFC1a and the active component T" of the detection component 270 are both similar to the electronic apparatus 10 in FIG. 1, where the detailed descriptions thereof may be referenced to the relevant paragraphs in the previous embodiment, and are thus not hereinafter further elaborated.

In sum, in the electronic apparatus according to one embodiment of the present disclosure, the microfluidic channels disposed in the stretchable layer are filled with liquid conductors, thus forming electrical signal transmission paths between a plurality of electronic components. Since the channel layers are stretchable, when the electronic apparatus is extended, the connection area between the functional areas expands. By disposing the buffer bag, when the microfluidic channels are extended, the electrical connection between the liquid conductor and the electronic components in different functional areas may be ensured, thus further ensuring both the stretchability and stability of the electrical signal transmission paths. On the other hand, in the method of fabricating the electronic apparatus according to one embodiment of the present disclosure, the low temperature attaching process is utilized to form at least one stretchable layer, thus increasing the design and manufacturing elasticity of the microfluidic channels in the channel layer.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electronic apparatus, comprising:

a component layer, having a plurality of functional areas separated from each other and a connection area outside the functional areas, wherein the component layer comprises:

a plurality of electronic components, disposed in at least some of the functional areas; and a channel layer, overlapping with the component layer, wherein the channel layer comprises:

at least one stretchable layer;

a plurality of first microfluidic channels, disposed in the at least one stretchable layer, and extending through the functional areas and the connection area; and a first liquid conductor, filled in the first microfluidic channels, and electrically connected to at least some of the electronic components, wherein each of the first microfluidic channels is provided with a buffer bag.

2. The electronic apparatus according to claim 1, wherein the buffer bag is disposed in the connection area.

3. The electronic apparatus according to claim 1, wherein the functional areas comprise a first functional area and a second functional area adjacent to each other and arranged at an interval, the electronic components comprise a first active component disposed in the first functional area and a second active component disposed in the second functional area, the channel layer further comprises a second microfluidic channel, and the second microfluidic channel is in communication between the first active component and the second active component.

4. The electronic apparatus according to claim 3, wherein the channel layer further comprises a second liquid conductor, filled in the second microfluidic channel, and electrically connected to the first active component and the second active component.

5. The electronic apparatus according to claim 3, wherein the second microfluidic channel has a depth in an overlapping direction of the component layer and the channel layer, and has a width in a direction perpendicular to an extending direction of the second microfluidic channel, wherein a ratio of the depth to the width is greater than or equal to 0.2 and less than or equal to 1.

6. The electronic apparatus according to claim 3, wherein at least one side of the second microfluidic channel is adjacent to at least one spacer.

7. The electronic apparatus according to claim 1, wherein in a direction perpendicular to an extending direction of each of the first microfluidic channels, each of the first microfluidic channels has a first width, the buffer bag has a second width, and a ratio of the second width to the first width is greater than 1 and less than or equal to 5.

8. The electronic apparatus according to claim 7, wherein each of the first microfluidic channels has a first depth in an overlapping direction of the component layer and the channel layer, the buffer bag has a second depth in the overlapping direction, and a ratio of the second depth to the first depth is greater than 1 and less than or equal to 10.

9. The electronic apparatus according to claim 1, wherein each of the first microfluidic channels has a depth in an overlapping direction of the component layer and the channel layer, and has a width in a direction perpendicular to an extending direction of each of the first microfluidic channels, wherein a ratio of the depth to the width is greater than or equal to 0.5 and less than or equal to 10.

10. The electronic apparatus according to claim 1, further comprising:

a plurality of spacers, disposed in the connection area, and arranged at intervals on at least one side of each of the first microfluidic channels.

11. The electronic apparatus according to claim 10, wherein the at least one stretchable layer comprises a first stretchable layer and a second stretchable layer, at least one of the first stretchable layer and the second stretchable layer is provided with the first microfluidic channels, and each of the spacers extends in the first stretchable layer and the second stretchable layer.

12. The electronic apparatus according to claim 10, wherein a ratio of a Young's Modulus of the spacers to a Young's Modulus of the at least one stretchable layer is greater than 100.

13. The electronic apparatus according to claim 1, wherein at least one of the functional areas is provided with another buffer bag.

14. The electronic apparatus according to claim 13, wherein the another buffer bag is in communication with one of the first microfluidic channels and a micropump structure.

15. The electronic apparatus according to claim 1, wherein a normal projection contour of each of the first microfluidic channels extending in an extending direction on a cross-section perpendicular to the extending direction is rectangular.

16. The electronic apparatus according to claim 15, wherein each of the first microfluidic channels has a depth in an overlapping direction of the component layer and the channel layer, and has a width in a direction perpendicular to the extending direction and the overlapping direction, wherein a ratio of the depth to the width is greater than or equal to 3 and less than or equal to 5.

17. The electronic apparatus according to claim 1, wherein the functional areas comprise a first functional area, a second functional area and a third functional area, the electronic components comprise a micropump structure disposed in the first functional area, a heater disposed in the second functional area and an detection component disposed in the third functional area, the channel layer further comprises a second microfluidic channel, the second microfluidic channel is in communication between the micropump structure, the heater and the detection component, and the second microfluidic channel is configured to be filled with a fluid to be detected.

18. A method of fabricating an electronic apparatus, comprising:

sequentially forming a first stretchable layer and a metal layer on a temporary substrate;

performing a patterning process to the metal layer to form a plurality of metal patterns;

performing a first micromachining process to the first stretchable layer to form a first microfluidic channel;

performing a corrosive process to the metal patterns to form a liquid conductor; and performing a low temperature attaching process of a second stretchable layer on the first stretchable layer, wherein the second stretchable layer covers the liquid conductor, and a processing temperature of the low temperature attaching process is lower than 20° C.

19. The method of fabricating the electronic apparatus according to claim 18, further comprising:

performing a second micromachining process to the first stretchable layer and the second stretchable layer to form another first microfluidic channel and a plurality of recesses, wherein the recesses are disposed on at least one side of the first microfluidic channel or the another first microfluidic channel; and forming a plurality of spacers in the recesses of the first stretchable layer and the second stretchable layer.

* * * * *